United States Patent
Nath et al.

(10) Patent No.: US 8,650,180 B2
(45) Date of Patent: Feb. 11, 2014

(54) EFFICIENT OPTIMIZATION OVER UNCERTAIN DATA

(75) Inventors: Suman K. Nath, Redmond, WA (US);
Seung Ho Lee, Bellevue, WA (US);
Slawomir Smyl, Kirkland, WA (US);
Charles Z. Loboz, Redmond, WA (US);
Oliver Andrzej Kennedy, Lausanne (CH)

(73) Assignee: Microsoft Corporation, Redmond, WA (US)

( * ) Notice: Subject to any disclaimer, the term of this patent is extended or adjusted under 35 U.S.C. 154(b) by 27 days.

(21) Appl. No.: 13/164,573

(22) Filed: Jun. 20, 2011

(65) Prior Publication Data
US 2012/0323926 A1 Dec. 20, 2012

(51) Int. Cl.
*G06F 7/00* (2006.01)
*G06F 17/30* (2006.01)

(52) U.S. Cl.
USPC .......... 707/713; 707/736; 707/758; 707/769; 703/22

(58) Field of Classification Search
USPC ............. 707/713, 736, 758, 769; 703/22
See application file for complete search history.

(56) References Cited

U.S. PATENT DOCUMENTS

| 8,290,972 | B1* | 10/2012 | Deshmukh et al. | ............. 707/758 |
| 2002/0022947 | A1* | 2/2002 | Kurata | ............................... 703/2 |
| 2004/0019872 | A1* | 1/2004 | Lippincott et al. | .............. 716/21 |
| 2004/0128117 | A1* | 7/2004 | Crandall et al. | .................. 703/2 |
| 2010/0312775 | A1* | 12/2010 | Haas et al. | ..................... 707/759 |
| 2011/0196659 | A1* | 8/2011 | Salle et al. | ......................... 703/6 |
| 2011/0320184 | A1* | 12/2011 | Beyer et al. | ...................... 703/22 |

OTHER PUBLICATIONS

Neal, Radford, M., "Probabilistic Inference Using Markov Chain Monte Carlo Methods", Retrieved at <<http://citeseerx.ist.psu.edu/viewdoc/download?doi=10.1.1.36.9055&rep=rep1&type=pdf>>, Technical Report CRG-TR-93-1, Sep. 25, 1993, 144 Pages.
Efendiev, et al., "Preconditioning Markov Chain Monte Carlo Simulations Using Coarse-Scale Models", Retrieved at <<http://citeseerx.ist.psu.edu/viewdoc/download?doi=10.1.1.90.68&rep=rep1&type=pdf>>, SIAM J. Sci. Comput., vol. 28, No. 2, May 26, 2006, pp. 776-803.
Feyen, et al., "Semi-Distributed Parameter Optimization and Uncertainty Assessment for Large-Scale Streamflow Simulation Using Global Optimization", Retrieved at <<http://jasper.eng.uci.edu/pdf/36.pdf>>, Hydrological Sciences—Journal—des Sciences Hydrologiques, 53(2), Apr. 2008, pp. 293-308.
Haas, et al., "Database Meets Simulation: Tools and Techniques", Retrieved at <<http://informs-sim.org/2009informs-simworkshop/paper121-126.pdf>>, Proceedings of the 2009 INFORMS Simulation Society Research Workshop, 2009, pp. 119-124.

(Continued)

*Primary Examiner* — Hares Jami
(74) *Attorney, Agent, or Firm* — Steve Wight; Carole Boelitz; Micky Minhas

(57) ABSTRACT

The subject disclosure is directed towards using fingerprints, comprising lists of simulation results corresponding to partial (random sampled) simulation results, to determine whether a full simulation may be avoided by reusing simulation results from a previous full simulation. Before running a full simulation, a current fingerprint is obtained via a partial simulation. If a previous fingerprint matches (is identical or similar to) the current fingerprint, the associated previous results are reused. Also described is indexing fingerprint data to facilitate efficient lookup-based fingerprint matching.

20 Claims, 4 Drawing Sheets

(56) References Cited

OTHER PUBLICATIONS

Wick, et al., "Scalable Probabilistic Databases With Factor Graphs and MCMC", Retrieved at <<http://arxiv.org/PS_cache/arxiv/pdf/1005/1005.1934v1.pdf>>, May 11, 2010, 11 Pages.

Stark, et al., "Multiple-Order Markov Chain Monte Carlo Sampling Methods With Application to a Changepoint Model", Retrieved at <<http://citeseerx.ist.psu.edu/viewdoc/download?doi=10.1.1.56.3048&rep=rep1&type=pdf>>, Signal Processing and Communications Laboratory, Technical Report CUED/F-INFENG/TR. 302, Sep. 1997, 20 Pages.

Miyamae, et al., "Natural Policy Gradient Methods With Parameter-Based Exploration for Control Tasks", Retrieved at <<http://books.nips.cc/papers/files/nips23/NIPS2010_0606.pdf>>, Retrieved on Mar. 15, 2011, 9 Pages.

Ripley, Brian D., "The R Project in Statistical Computing", Retrieved at <<http://ltsn.mathstore.ac.uk/newsletter/feb2001/pdf/rproject.pdf>>, Retrieved on Mar. 8, 2011, pp. 23-25.

Zhang, et al., "I/O-Efficient Statistical Computing With RIOT", Retrieved at <<http://ieeexplore.ieee.org/stamp/stamp.jsp?tp=&arnumber=5447819>>, 2010 IEEE 26th International Conference on Data Engineering, Mar. 1-6, 2010, pp. 1157-1160.

Ahmad, et al., "Simultaneous Equation Systems for Query Processing on Continuous-Time Data Streams", Retrieved at <<http://ieeexplore.ieee.org/stamp/stamp.jsp?tp=&arnumber=4497475>>, ICDE 2008, IEEE 24th International Conference on Data Engineering, 2008, Apr. 7-12, 2008, pp. 666-675.

Ahmed, et al., "Discrete Cosine Transform", Retrieved at <<http://ieeexplore.ieee.org/stamp/stamp.jsp?tp=&arnumber=1672377>>, IEEE Transactions on Computers, vol. C-23, Issue 1, Jan. 1974, pp. 90-93.

Antova, et al., "MayBMS: Managing Incomplete Information With Probabilistic World-Set Decompositions", Retrieved at <<http://ieeexplore.ieee.org/stamp/stamp.jsp?tp=&arnumber=4221832>>, IEEE 23rd International Conference on Data Engineering, 2007, ICDE 2007, Apr. 15-20, 2007, pp. 1479-1480.

Boulos, et al., "MYSTIQ: A System for Finding More Answers by Using Probabilities", Retrieved at <<http://www.cs.washington.edu/homes/suciu/demo.pdf>>, SIGMOD 2005, Jun. 14-16, 2006, Baltimore, Maryland, USA, 3 Pages.

Deshpande, et al., "MauveDB: Supporting Model-Based User Views in Database Systems", Retrieved at <<http://db.csail.mit.edu/pubs/sigmod06-mauvedb.pdf>>, SIGMOD 2006, Jun. 27-29, 2006, Chicago, Illinois, USA, 12 Pages.

Devroye, Luc, "Non-Uniform Random Variate Generation", Retrieved at <<http://citeseerx.ist.psu.edu/viewdoc/download?doi=10.1.1.85.8760&rep=rep1&type=pdf>>, Retrieved on Mar. 8, 2011, 39 Pages.

Gibas, et al., "A General Framework for Modeling and Processing Optimization Queries", Retrieved at <<http://www.vldb.org/conf/2007/papers/research/p1069-gibas.pdf>>, VLDB '07, Sep. 23-28, 2007, Vienna, Austria, pp. 1069-1080.

Arumugam, et al., "MCDB-R: Risk Analysis in the Database", Retrieved at <<http://www.almaden.ibm.com/cs/people/peterh/172.pdf>>, Proceedings of the VLDB Endowment, vol. 3, No. 1, 36th International Conference on Very Large Data Bases, Sep. 13-17, 2010, Singapore, 12 Pages.

Jampani, et al., "MCDB: A Monte Carlo Approach to Managing Uncertain Data", Retrieved at <<http://www.cise.ufl.edu/~feixu/mcdb.pdf>>, SIGMOD '08, Jun. 9-12, 2008, Vancouver, BC, Canada, pp. 687-700.

Kennedy, et al., "PIP: A Database System for Great and Small Expectations", Retrieved at <<http://www.cs.cornell.edu/~okennedy/papers/pip.icde2010.pdf>>, Retrieved on Mar. 8, 2011, 12 Pages.

Landi, William, "Undecidability of Static Analysis", Retrieved at <<http://citeseerx.ist.psu.edu/viewdoc/download?doi=10.1.1.35.9722&rep=rep1&type=pdf>>, ACM Letters on Programming Languages and Systems, vol. 1, No. 4, Dec. 1992, pp. 323-337.

Mutsuzaki, et al., "Trio-One: Layering Uncertainty and Lineage on a Conventional DBMS", Retrieved at <<http://www.cidrdb.org/cidr2007/papers/cidr07p30.pdf>>, 3rd Biennial Conference on Innovative Data Systems Research (CIDR), Jan. 7-10, 2007, Asilomar, California, USA, pp. 269-274.

Singh, et al., "Orion 2.0: Native Support for Uncertain Data", Retrieved at <<http://orion.cs.purdue.edu/docs/orion2-demo.pdf>>, SIGMOD '08, Jun. 9-12, 2008, Vancouver, BC, Canada, 3 Pages.

Thiagarajan, et al., "Querying Continuous Functions in a Database System", Retrieved at <<http://db.csail.mit.edu/pubs/fp438-thiagarajan.pdf>>, SIGMOD '08, Jun. 9-12, 2008, Vancouver, BC, Canada, 14 Pages.

Safizadeh, et al., "Optimization in Simulation Experiments Using Response Surface Methodology", Retrieved at <<http://www.sciencedirect.com/science/article/pii/0360835284900184>>, Comput. & Indus. Engng, vol. 8, No. 1, 1984, pp. 11-27.

Xu, et al., "E=MC3: Managing Uncertain Enterprise Data in a Cluster-Computing Environment", Retrieved at <<http://dl.acm.org/citation.cfm?id=1559893>>, SIGMOD '09, Jun. 29-Jul. 2, 2009, Providence, Rhode Island, USA, pp. 441-454.

\* cited by examiner

EFFICIENT OPTIMIZATION OVER UNCERTAIN DATA

BACKGROUND

Enterprises often evaluate various business scenarios to assess and manage their financial, engineering, and operational risks arising from uncertain data. Analyzing risks to make future plans may involve millions of dollars, whereby accurate and efficient simulation of various business scenarios is needed desired to establish the validity of possible decisions in a timely manner.

By way of example, consider an analyst who wants to forecast the risk of running out of processing capacity of a cloud infrastructure. For that, the analyst needs to combine various predictive models for CPU core demands and availability. These models are inherently uncertain due to imprecise prediction of future workload, possible downtime, delayed deployment, and so forth.

One tool for combining various predictive models is based upon probabilistic database systems that use probability distributions and models. Some probabilistic database systems allow users to evaluate queries that combine multiple externally defined models through invocations of stochastic blackbox functions (also called variable-generation (VG) functions); queries are evaluated over VG-Functions by Monte Carlo sampling.

A challenge faced by probabilistic database-based simulation systems arises when models are parameterized and the system needs to explore a large parameter space to optimize for a given goal. Returning to the above example, a CPU core availability model may accept a set of candidate purchase dates and apply them according to a model for how long it takes to bring the hardware online. The analyst can then identify purchase dates that minimize the cloud's cost of ownership given a bound on the risk of overload. This is essentially a constrained optimization problem, in which each iteration is an entire probabilistic database query.

A problem with this approach is the repeated (and potentially very costly) invocation of VG-Functions, in that each function is evaluated for most, if not all, possible parameter values, and the function may need to be evaluated over a range of steps (e.g., if it describes time series data, like a daily CPU demand model), and output at each step may be dependent on prior steps. Therefore, with parameterization, even relatively simple scenarios can an unacceptable amount of time in many practical situations where a business decision must be made quickly and/or various parameterized what-if scenarios must be evaluated in an interactive way. In sum, probabilistic database-based simulation systems become extremely slow when models are parameterized and the system is asked to explore a large parameter space to optimize for a given goal. Any solution that makes the process of parameter exploration faster is thus desirable.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

Briefly, various aspects of the subject matter described herein are directed towards a technology by which full simulation for some parameter combinations in uncertain data (e.g., probabilistic database) query handling may be avoided by evaluating representative data (a "fingerprint") of previous partial simulations to determine whether a previous fingerprint matches (is identical or similar to) a fingerprint of the current parameter combination. If so, the previous simulation results may be used for the current parameter combination. A current fingerprint representative of a current parameter combination is obtained, e.g., by partial simulation using a corresponding random subset of tables. If the current fingerprint is similar or identical to a previous fingerprint, simulation results associated with the similar or identical fingerprint may be used to provide simulation results for the current parameter combination. Otherwise, a full simulation using the current parameter combination is performed to obtain the simulation results.

In one aspect, similarity is determined by whether the similar fingerprint and the current fingerprint have a mathematical (e.g., linear or other functional) relationship with one another. This may be accomplished by maintaining normalized fingerprints, and normalizing the current fingerprint to see if its normalized representation matches a normalized (previously obtained) fingerprint. The simulation results provided for the current parameter combination may be adjusted based upon the relationship/account for the normalization, e.g., if one fingerprint has double the results of the similar one, the simulation results associated with the similar fingerprint are doubled for, associating with the current parameter combination.

In one aspect, an index representative of a set of previously obtained fingerprints is obtained, and accessed to efficiently determine whether an identical/similar fingerprint exists. An index may be based upon normalized representations of the previously obtained fingerprints. An index may be based upon sorting results in the fingerprint, and using position information of the results as an identifier; a similar identifier computed for the current fingerprint may be used to retrieve candidate fingerprints from the index, with candidate fingerprints evaluated against the current fingerprint for a match.

In one aspect, a probabilistic database system analysis tool is coupled to (incorporates or communicates with) a fingerprint mechanism that is configured to maintain fingerprint data representative of subsets of probabilistic database table processing operations. Example processing operations include simulations for different parameter combinations, inter-model dependency processing and refinement, validation, or exploration processing tasks.

Other advantages may become apparent from the following detailed description when taken in conjunction with the drawings.

BRIEF DESCRIPTION OF THE DRAWINGS

The present invention is illustrated by way of example and not limited in the accompanying figures in which like reference numerals indicate similar elements and in which.

DETAILED DESCRIPTION

Figure 1:
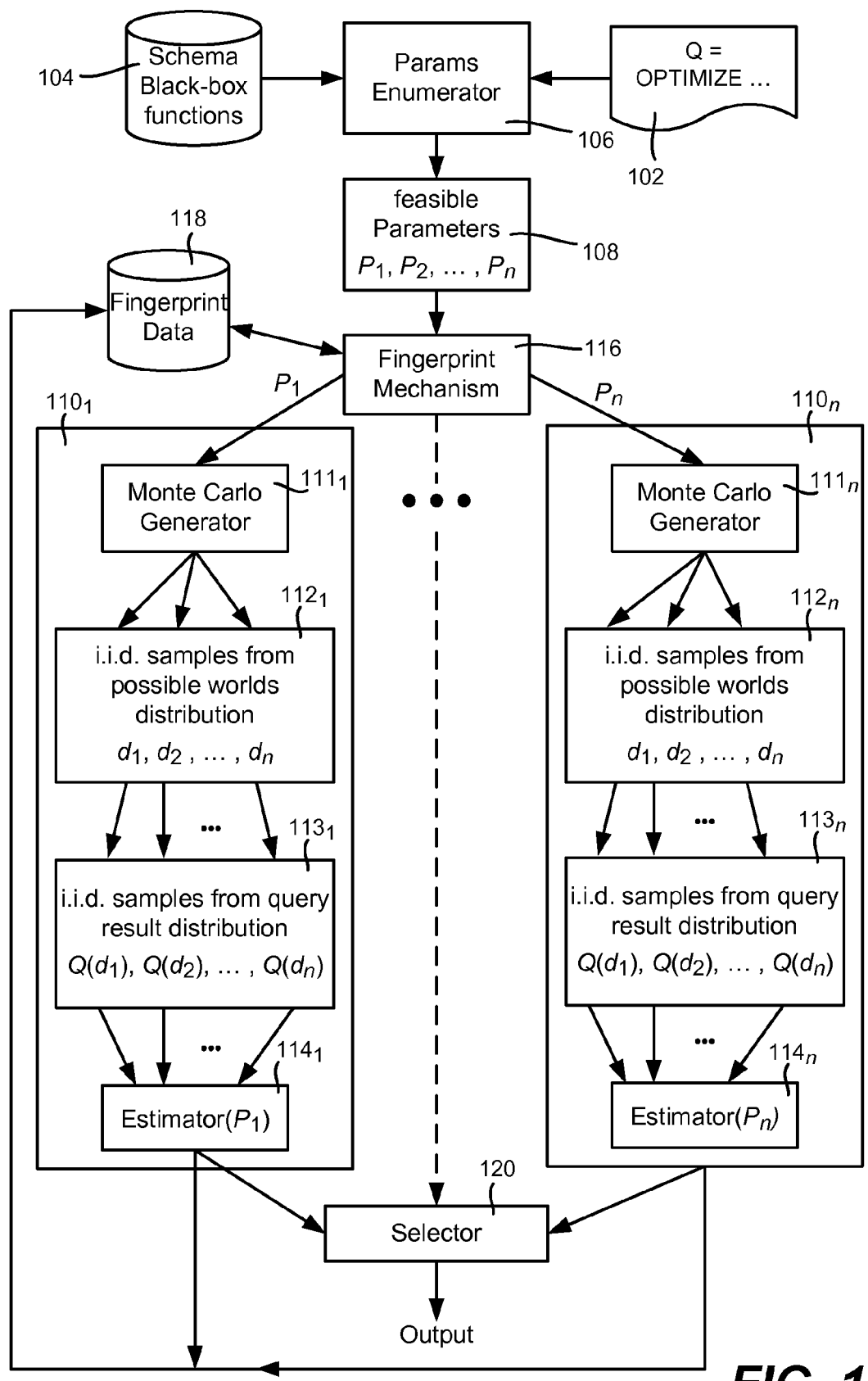
FIG. 1 is a block diagram showing example components for processing an optimization query in an analysis tool configured with a fingerprint mechanism for speeding up the processing.

Various aspects of the technology described herein are generally directed towards a "fingerprinting" technique in a probabilistic database system analysis tool that identifies correlations between a query's output distribution for different parameter values, which allows existing simulation results to be reused rather than re-running a full simulation to obtain the results. In general, a fingerprint of a simulation may be obtained by a partial run of a small set of samples through a Monte Carlo simulator (or the like). The technique significantly decreases the time taken to obtain the simulation results, on the order of two orders of magnitude faster in evaluated business scenarios.

It should be understood that any of the examples described herein are non-limiting examples. For one, while a Monte Carlo-based simulator is exemplified, other simulator technologies may be used. As such, the present invention is not limited to any particular embodiments, aspects, concepts, structures, functionalities or examples described herein. Rather, any of the embodiments, aspects, concepts, structures, functionalities or examples described herein are non-limiting, and the present invention may be used in various ways that provide benefits and advantages in computing and data processing in general.

Probabilistic database (PDB) systems allow users to pose queries over uncertain data, namely data specified as a distribution over a range of possible values, rather than as one specific value. For example, optical character recognition (OCR) may have difficulty distinguishing between a 9 and a 4. In a traditional DBMS, only one of these two values can be recorded, even if there is not enough information to decide which is correct. A probabilistic database system records both values and their corresponding probabilities. When the data is queried, the response may be phrased as a distribution over possible results. Many probabilistic database system implementations can similarly store and query continuous distributions (e.g. a Gaussian distribution representing a measurement and its statistical error). While a traditional DBMS stores a single instance of a database, a database in a probabilistic database system represents a distribution over a (potentially infinite) set of database instances, each referred to as a possible world.

Queries in a probabilistic database system are (conceptually) evaluated by evaluating the query in each possible world, and instantiating a distribution over the set of results. This approach is not practical in many scenarios, and thus probabilistic database systems typically approximate the same result by using various Monte Carlo methods. One Monte Carlo database system instantiates a finite set of databases by sampling randomly from the set of possible worlds. Queries are run on each sampled world in parallel, and the results are aggregated into a metric (e.g., an expectation or standard deviation of the result) or binned into a histogram. Note that this system interacts with the distributions being queried by taking samples. This simple interface makes it possible for users to incorporate (nearly) any distribution into their queries. User-defined probability distributions (e.g. a user demand forecast) can be incorporated by constructing a stochastic black-box function referred to as a VG-Function, which generates samples drawn from the distribution.

FIG. 1 is a block diagram including a probabilistic database analysis tool that processes an optimization query 102. Given schema black-box functions 104 and the query 102, a parameter enumerator component 106 outputs the feasible parameters 108 that may be combined for simulations.

As described below, once at least one simulation has been run in a Monte Carlo simulation $110_1$, (e.g., via blocks $111_1$-$114_1$) for a parameter combination based upon parameter $P_1$, a fingerprint mechanism 116 accesses fingerprint data 118 (e.g., a set of basis distributions, fingerprints indicative of a simulation result, samples, and/or pre-computed statistical metrics such as mean and standard deviation) to determine whether a full simulation needs to be run for the next parameter combination. To this end, a fingerprint is obtained for the next parameter combination by selecting only a small random sample of the tables (e.g., ten instead of one-thousand available) and running the simulation on the sample set to obtain a list of results, which corresponds to the fingerprint.

If there is a similar fingerprint in the data 118, the results of the similar simulation may be reused, and the full simulation need not be run for that parameter combination. Otherwise the simulation is run; (note that the last Monte Carlo simulation $110_n$ shown in FIG. 1 may or may not be run as determined via fingerprint similarity).

When the full set of simulation results are obtained, either by running the simulation or by obtaining reused simulation results based on fingerprint similarity, a selector 120 provides an output based on the results. Selection from the results operates in a known manner, except that some of the results from which to select not obtained via a full simulation, but rather from re-using an existing simulation as described herein. As can be seen, avoiding full simulations based on similar fingerprints significantly speeds up the analysis process.

Figure 2:
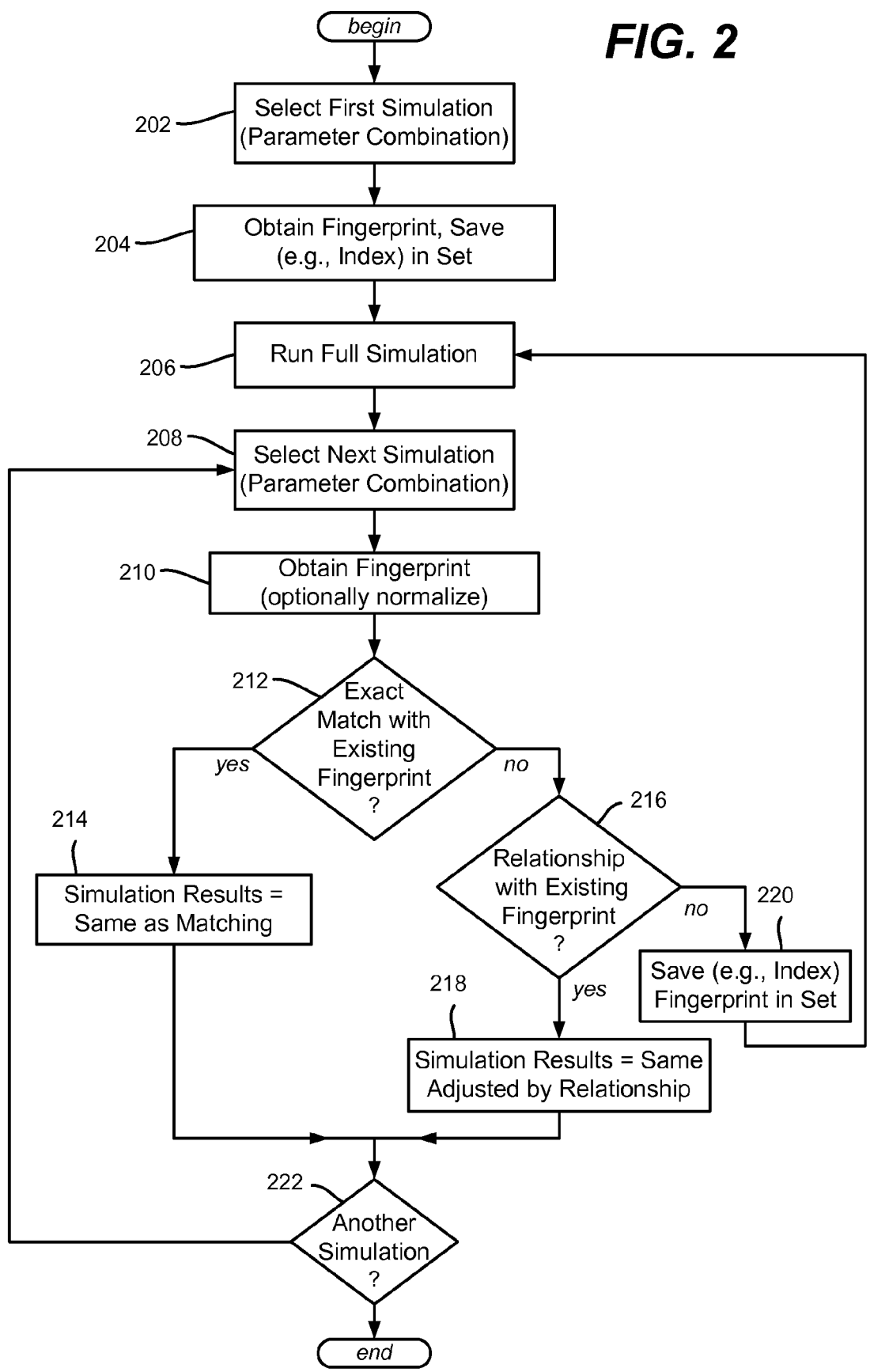
FIG. 2 is a flow diagram showing example steps that may be performed to run simulations or use previous simulation results based upon fingerprints.

FIG. 2 is a flow diagram showing example steps that may be taken to use fingerprints to avoid running a complete set of simulations, beginning at step 202 where a first parameter combination is selected for running as a simulation. Step 204 represents obtaining the fingerprint for this simulation and saving it in the fingerprint data, which may be indexed as described below. Step 206 represents running the full simulation; (note that the fingerprint may be obtained after the full simulation).

Step 208 selects the next parameter combination/simulation to possibly run. Before it is run, step 210 obtains a fingerprint, e.g., by running simulations on only a small sample of the tables.

Step 212 represents evaluating the fingerprint against the existing fingerprint set to look for an exact match. If an exact match is found, step 214 sets the simulation results for this parameter combination to be the same as the simulation results corresponding to the matching fingerprint, that is, the simulation results are reused for this parameter combination.

If an exact match is not found, step 216 evaluates the fingerprint for whether it has a functional (e.g., linear) relationship with an existing fingerprint. For example, one (four sample) fingerprint may be $\{1, 2, 4, 3\}$; a similar fingerprint may be $\{2, 4, 8, 6\}$ because of a linear relationship ($\alpha x + \beta$) with that fingerprint (as described below with reference to algorithm 2). Thus, these fingerprints are similar ($\alpha=2$, $\beta=0$), and step 218 reuses the previous results for this parameter combination, with an adjustment made to the full set based upon the relationship function, e.g., doubling each result in the above example. As described below, normalization and/or sorting may be used to facilitate finding a relationship. Non-linear functions and other similarity comparisons are also feasible.

If there is not an exact match (step 212) nor any relationship found (step 216) between the current fingerprint and a previous fingerprint, then the current fingerprint is saved (e.g., indexed) in the set at step 220, and a full simulation is run (step 206). Step 222 repeats the process for each parameter combination corresponding to a simulation for which results are desired.

As described below, a fingerprint may be normalized, with a normalized value of the fingerprint maintained in an index. For example, $\{1, 2, 4, 3\}$ may be normalized to $\{0, 1, 3, 2\}$ (by subtracting one from each result in the list. The fingerprint $\{2, 4, 8, 6\}$ also may be normalized to $\{0, 1, 3, 2\}$ (by dividing each result in the list by two and then subtracting one). Thus, instead of performing step 216, step 210 may be configured to obtain and normalize the fingerprint, with step 212 evaluating the normalized fingerprint against the set (an index) of normalized fingerprints. In general, such an index lookup is more efficient than first looking for an exact match, followed by looking for a relationship, to find the same or similar fingerprints.

Turning to additional details, and continuing with the above cloud infrastructure example, consider that the analyst wants to determine the optimal date and volume of new server purchases to keep the risk of running out of available CPU cores below a certain threshold. The later the purchases occur, the lower the hardware's upkeep costs, but the greater the chance that cores will be unavailable when needed. Thus, the question of an ideal purchase date and volume can be answered by solving a constrained optimization problem. The analyst (user) may use a probabilistic database-based analytics tool to specify this optimization problem in three stages: (1) the user defines stochastic models forecasting CPU core availability and demand, (2) the user specifies inter-model interactions to describe the CPU usage scenario, and (3) the tool solves the optimization problem by exploring the parameter space of purchase dates and volumes.

As described herein, such an analytics tool may use fingerprint technology to reduce the number of Monte Carlo evaluations needed to provide a result. In general and as exemplified above, a fingerprint of a stochastic black box function is a concise data structure (e.g., a results list) that that summarizes its output distribution and is straightforward to compute. As will be understood, a fingerprint may be used to determine a function's similarity with another function, and/or its own instantiations under different parameter values.

By way of example, consider that a stochastic black box function F produces similar outputs under values $P_i$ and $P_j$ of a parameter (denoted as $F(P_i) \sim F(P_j)$). Then, fingerprint(F $(P_i)$)=M(fingerprint(F($P_j$))) where M is a closed-form mapping function, as described below. Fingerprints can be computed from a single black-box function, or a combination of such functions, such as an entire Monte Carlo simulation $110_1$-$110_n$ shown in FIG. 1. Denoting the Monte Carlo simulation $110_1$ of FIG. 1 as F, $F(P_i) \sim F(P_j)$ implies that the outputs of Estimator($P_i$) will be similar to that of Estimator($P_j$). Thus, with an efficient technique available for computing fingerprints and detecting such similarity, at least some expensive Monte Carlo simulations may be avoided for parameter value $P_j$, providing accurate estimation of the output of Estimator ($P_j$) accurately from the output of Estimator($P_i$).

Turning to computing fingerprints, determining whether the outputs of two functions are similar is in general a difficult problem. Described herein is a probabilistic approach based on the principle of random testing (a well-known technique in software testing). For random testing of a deterministic function F against a hypothesis function H, F is evaluated on $m \geq 1$ random inputs and the corresponding outputs are compared to expected outcomes of H. The function F is declared as satisfying the hypothesis H if the outputs of F and H match for the random inputs. The value of m needs to be chosen such that the different code paths in F are executed at least once. The above principle determines similarities of outputs of a stochastic black-box function F under two values $P_i$ and $P_j$ of the same parameter. Note that in cloud infrastructure management, most stochastic functions are relatively simple and contain at most one or two conditional branches, and thus, evaluating F at a small number m of random inputs suffices for this type of analysis.

Algorithm 1 below shows an example of one such function. This function produces a prediction of weekly usage, which is linearly growing, normally distributed with a discontinuity at the point where current week and feature are equal. The function has only one branching condition.

---

Algorithm 1 Usage(current_week, feature)

---

Require: The current_week being simulated, and a
    feature release date.
Ensure: The demand for the week being simulated.
  1:    begin Usage(current_week, feature)
  2:    usage = Normal(
        $\mu$ : 1 * current_week,
        $\sigma^2$ : 0.1 * current_week
        )
  3:    if current_week > feature then
  4:        usage +=Normal(
        $\mu$ : 0.2 * (current_week − feature),
        $\sigma^2$ : 0.2 * (current_week − feature)
        )
  5:    return usage

---

Random testing may be used for stochastic functions as follows. To test if $F(P_i) \sim F(P_j)$, the same source of randomness is used in both $F(P_i)$ and $F(P_j)$. Suppose, the function F uses one pseudorandom number generator as its source of randomness and $F_s(P)$ denotes the function's output under parameter value P and random seed s. Then, for a sequence of random seeds $(s_1, s_2, \ldots, s_m)$, compute the pairs $(\{F_{s1}(P_i); F_{s1}(P_j)\}, \ldots, \{F_{sm}(P_i), F_{sm}(P_j)\})$. Then declare:

$$F(P_i) \sim_M F(P_j).$$

If there exists a mapping function M such that $\forall k \in (0, m)$, $$F_{sk}(P_i) = M(F_{sk}(P_j))$$

As can be readily appreciated, it is nearly always possible to produce an M that fits this system of equations. Thus, when deciding similarity, the search space may be restricted to specific classes of mapping functions. In one implementation, the analysis tool natively searches for linear mappings (e.g., $M_{\alpha,\beta}(x) = \alpha x + \beta$), a process described below in Algorithm 2. However, the notion of similarity of two signatures can be application-dependent, and thus the analysis tool allows users to provide their own mapping functions.

---

Algorithm 2 FindLinearMapping($f_1, f_2$)

---

Require: Two fingerprints $f_1$ and $f_2$ of size m
Ensure: A linear function $\mathcal{M}(x) = \alpha x + \beta$ such that
    $\mathcal{M}(f_1[i]) = f_2[i]$, $\forall i$, and null if no such function exists
  1:    $\alpha \leftarrow (f_2[1] - f_2[2])(f_1[1] - f_1[2])$
  2:    $\beta \leftarrow f_2[1] - \alpha f_1[1]$
  3:    match $\leftarrow$ true
  4:    for i = 3 to m do
  5:        if $\alpha f_1[i] + \beta \neq f_2[i]$ then
  6:            match $\leftarrow$ false
  7:    return $(\mathcal{M}(x) = \alpha x + \beta)$ if match, null otherwise As can be seen, algorithm 2 generally uses the first two entries of each fingerprint to find a linear ($\alpha x+\beta$) relationship, and then uses the next (e.g., eight) entries to verify that the relationship holds for the other entries.

Note that the two stochastic functions need to be evaluated with the same source of randomness to make their comparison meaningful. Consider two stochastic functions that output 0 and 1 with equal probability. When repeatedly evaluated with the same random seed, they can be quickly declared to be equivalent with a very high probability. In addition, by using the same random seed value to initialize the pseudorandom number generator on each invocation, it is ensured that there is not just a correlation, but a linear mapping from one fingerprint to the other. Note that using the same set of random seeds for different parameter values does not affect the correctness of the analysis tool's Monte Carlo simulations.

Because the seeds used by each Monte Carlo Generator (e.g., $111_1$, FIG. 1) are independent and identically distributed (i.i.d.) random, inputs to the Estimator($P_i$) are independent and identically distributed samples from query result distribution. As a result, the output of Estimator($P_i$) remains statistically correct. Using same set of seeds for different parameter values introduces correlated error terms into the outputs of different Estimators, but the Selector only compares, and does not combine, the Estimator's outputs.

The above observation provides a way to construct fingerprints. Given a stochastic function F and a parameter value P, its fingerprint comprises the list ($F_{s1}(P), F_{s2}(P), \ldots, F_{sm}(P)$), where ($s_1, s_2, \ldots, s_m$) is a list of global random seed values used for the functions. The value of m is set based on F's branching factor and by the author of F, large enough such that m random inputs execute the code paths in F. In one use of the analysis tool, a value of m~10 has been found sufficient for functions with one or two conditional branches. Thus, computing fingerprints is significantly cheaper than a full Monte Carlo simulation because the fingerprint length (m~10) is much smaller than the number of simulation rounds (n~1000). Note that because stochastic functions are evaluated on random inputs during Mote Carlo simulations, computation of fingerprints can be piggybacked with the first m simulation rounds.

With fingerprints, the analysis tool executes Monte Carlo simulations for different parameter values as follows. Let F denote the entire Monte Carlo simulation with a parameter value $P_i$ (i.e., the computation inside the dashed box in FIG. 3). Thus, the fingerprint of $F(P_i)$ is basically the outputs of first m simulation rounds with parameter $P_i$. During execution, one implementation of the analysis tool incrementally maintains a set of basis distributions, fingerprints, samples, and pre-computed statistical metrics (e.g. mean, standard deviation) for outputs of F for different parameter values. For a new parameter value $P_j$, the analysis tool first computes the fingerprint $f_j$ of $F(P_j)$ (as part of the first m rounds of simulation with parameter $P_j$). It then checks for a basis distribution with fingerprint f~$_M f_j$. If such a fingerprint f exists, the analysis tool omits the next (n-m) rounds of simulation for $P_j$ and uses the mapping function M to map simulation output for the parameter value with fingerprint f to guess simulation output for $P_j$. 3

As described above, the analysis tool may maintain a set of basis distributions with the fingerprints for which full simulation results have been computed. Thus, for a given fingerprint, the fingerprint mechanism needs to quickly find a basis distribution fingerprint that maps to the fingerprint (if any). Algorithm 3 below shows the process.

---
Algorithm 3 FindMatch(F, Pa)
---

Require: A stochastic black box function F, and a point
    in its parameter space $P_a$.
Ensure: The pair (basis, $\mathcal{M}$) or null, where basis is a basis
    distribution (fingerprint, sample set, metrics) and $\mathcal{M}$ is
    a mapping function such that $\mathcal{M}(s'[i]) = F_i(P_a), \forall i$.

1:   $f \leftarrow F_{|0,m)}(P_a)$
  2:   candidates $\leftarrow$ CandidateFingerprint(basis, f)
  3:   for all basis $\epsilon$ candidates do
  4:     $\mathcal{M} \leftarrow$ FindMapping(basis, f)
  5:     if $\mathcal{M} \neq$ null then
  6:       return (basis,$\mathcal{M}$)
  7:   $s \leftarrow F_{|m,n)}(P_a)$
  8:   return $\{(f, s, \text{Metrics}(f \circ s)), \mathcal{M}(x) = x)\}$

---

The analysis tool first uses a suitable indexing scheme (described below) to prune the search space of candidate basis distribution fingerprints. For each pairing candidate, the analysis tool uses a FindMapping function to discover a possible mapping between the two fingerprints. One example instance of the FindMapping function is the FindLinearMapping function, Algorithm 2, described above. If a mapping exists between two fingerprints, the analysis tool uses the mapping to reuse work done for the existing basis distribution. If no mappable fingerprint can be found, the analysis tool adds the fingerprint (along with the full simulation results for this fingerprint) to the set of basis distributions so that work done for the current parameter value may be reused if possible, by another parameter combination.

Turning to indexing of the fingerprints, while the applicability of mapping functions described above can be tested quickly, the test needs to be performed for each basis fingerprint. Thus, the time complexity of matching a basis distribution grows linearly with the size of the number of basis distributions. Rather than performing a naïve linear scan of every basis distribution, in one implementation, the analysis tool uses one of a plurality of strategies to index the basis distribution fingerprints. A general goal of indexing is to quickly find a set of candidate basis fingerprints that are similar to (e.g., that can be mapped to) a given fingerprint. The set of fingerprints returned by the index needs to contain each similar fingerprint. In addition, it may contain few fingerprints that are not similar to the given fingerprint; these false positives are later discarded in Algorithm 3.

One alternative indexing strategies that reduces the cost of matching a fingerprint down to a single hash-table lookup is based upon normalization. The normalization indexing strategy translates the fingerprints to their normal forms so that two similar fingerprints have the same normal form (and hence can be retrieved by a hash lookup). Such normalization requires a class of mapping functions that admits a normal form translation. For example, when using a linear mapping function, a fingerprint's normal form can be produced by taking the first two distinct sample values and identifying the linear translation that maps them to 0 and 1 (or, any two predefined constants) respectively. If two fingerprints have a linear mapping, then all, not just the first two, entries of their normal forms will be identical.

The above normalization technique also supports a more general n-variable mapping function where an entry of the output fingerprint is linearly related to n entries of the input fingerprint. In such a case, the normal form of a fingerprint is generated by making the first n entries of the fingerprint to n predefined constants such as $\{1/n, 2/n \ldots, 1\}$.

Another alternative indexing strategy is referred to as Sorted SID (sample identifiers). More particularly, the above normalization approach is based upon that the mapping function admitting a normalized representation of a fingerprint. In some situations (e.g., probabilistic mappings, or splines), no such normal form can be easily computed. In such cases, the analysis tool may assign an identifier to each sample value in a fingerprint (e.g., its index position in the fingerprint), using the same identifier ordering across the set of fingerprints.

A process 330 (FIG. 3) may sort the sample values in a fingerprint, and take the resulting sequence of sample identifiers (or, SIDs) as the hash key in the index. For example, in FIG. 3, fingerprint {4, 2, 6} (positions 1, 2, 3) after sorting in ascending order becomes {2, 4, 6} (positions 2, 1, 3), whereby 2,1,3 or a corresponding value (e.g., 213) becomes the SID/hash key for this entry. Note that similar fingerprints have the same hash, as represented by fingerprint {8, 4, 12}, and thus the set of candidates to evaluate may be found by a hash lookup that will locate any similar fingerprint. Further note that false positives are possible, e.g., {4, 2, 7} has the same SID, however these can be quickly scanned and eliminated from the candidate list.

As long as the mapping function is monotonically increasing, the resultant ordering of SIDs is consistent across the mappable distributions. By using the reverse ordering as well, this technique works with monotonic mapping functions, without requiring a normal form.

As can be readily appreciated, a fingerprint corresponds to a vector, and thus other (e.g., vector-based) techniques to find similar fingerprints may be used.

Turning to another aspect, fingerprints also may be used for other analysis. For example, the analysis tool allows users to specify inter-model dependencies. Consider two models where the first model predicts the release date of a particular feature of the cloud service, and the second model predicts demand, given that release date. Frequently, such dependencies are cyclical, in that the feature release date might be driven by demand. For example, sufficiently high demand may convince management to allocate additional development resources to the feature.

As a consequence of this sort of cyclical dependency, the models and hence the simulation may be evaluated as a Markovian process, where a model is evaluated in discrete steps and its output for any given step is dependent on the prior step's output. The discrete steps are usually small, e.g., a day in the above example, so that outputs of other models affecting the model remain static within a step. Each step in the process needs to be simulated, even if the only output of interest is for one specific step (e.g., user demand in two months).

In the space of cloud logistics, models with this sort of cyclical dependency often have one interesting characteristic, namely that the Markovian dependency is present only over certain steps. In the case of the feature release date, as long as the user demand remains strictly (or at least with high probability) below or above the threshold value, the feature release date is unaffected. Hence the demand and feature release date model can be treated as non-Markovian, despite its cyclical dependency. Concretely, Markovian dependencies in this sort of model are characterized as (1) infrequent, and (2) often closely correlated (3) discontinuities in (4) an otherwise non-Markovian process. Thus, given the state of the system at the beginning of one of these non-Markovian regions, it is possible to create a non-Markovian estimator function for the remainder of the region.

These infrequent, Markovian dependencies occur often in event-based simulations. Having programmers identify the ranges within which these dependencies occur is undesirable. Instead, the analysis tool can automatically identify non-Markovian regions in these processes by using fingerprints.

Consider a model F that needs to be evaluated in a sequence (or a chain) of discrete steps. Assuming that Markovian dependencies are infrequent, outputs of F in many successive steps will not be affected by previous steps. To jump over such non-Markovian steps and avoid expensive computation, the analysis tool uses various mechanisms. For one, the analysis tool may use a non-Markovian estimator function E, which predicts the outputs of F at different steps of the chain without considering the outputs (of F or other models) at previous steps. How the analysis tool gets such an estimator is described below. For another, the analysis tool may use fingerprints of F and E to efficiently check their similarity. As described herein, each fingerprint of F is a set of its random outputs. Thus, the fingerprint for any step in a Markov process can be used to generate the fingerprint for the next step. Instead of evaluating the full set of n Monte Carlo simulation rounds, only a fingerprint-sized (m<n) set is evaluated and compared to the fingerprint of an estimator function. If a mapping exists between the two, the process may skip directly to the next step.

More particularly, to compute the value of a Markovian black box function at a particular step in the chain, the analysis tool does an exponential-skip-length search of the chain until it finds a point where the estimator fails to provide a mappable fingerprint. From that point, the analysis tool performs a binary search to find the last point in the chain where the estimator provides a mappable fingerprint, uses the estimator to rebuild the state of the Markov process, generates the next step, and repeats the process. One such algorithm is shown in Algorithm 4:

---

Algorithm 4 MarkovJump($F_{Mkv}$, $F_{Est}$, initial, target)

---

Require: Two black-box functions, $F_{Mkv}$ and $F_{Est}$ describing a Markov process and its estimator, respectively; Typically, these are the same function. An initial state for the functions. A target number of steps to return after. A statically defined fingerprint size m.
Ensure: full, the state of each instance of the Markov process after target steps.
1:     full ← {initial, initial, . . . }
2:     fprint ← full[0 . . . m]
3:     i ← 0
4:     while i < targetStep do
5:         distance ← 1
6:         j ← 0
7:         history[0] ← fprint
8:         while i + j < target do
9:            while (i + j < target) ^ (j < distance) do
10:              j = j + 1
11:              history[j] ←
12:                  $F_{Mkv}$(j, history[j − 1])
13:            if $F_{Est}$(j, full[0 . . . m]) ≠ history[j] then
14:              if distance > 1 then
15:                j ←
16:                  $BinaryScan\left(j, j - \frac{distance}{2}, F_{Est}, history\right)$
17:              full = $F_{Est}$(j, full)
18:            else
19:              full = $F_{Mkv}$(j, full)
20:              j = j + 1
21:              fprint = full[0 . . . m]
22:              break
23:            else
24:              distance ← distance · 2
25:     i ← i + j Consider the previous example of a cyclically dependent user demand and feature release date models. The analysis tool begins with an estimator for the Markov process that assumes the feature has not yet been released (the initial system state). The analysis tool iterates over each step of the Markov process, computing only the fingerprint and not the full set of instances being generated. At each step, the fingerprint of the Markov function is compared to that of the estimator. The number of steps between comparisons grows exponentially until the algorithm finds a mismatch. At this point, the algorithm backtracks to the last matching value with a binary search and uses the estimator to regenerate the full state of the Markov process. The Markov process is used to step the full set of instances until the estimator function once again begins to produce matching fingerprints.

Turning to the estimator function, note that the user does not necessarily need to explicitly provide an estimator function. Simple cyclical dependencies between models allow extracting an estimator function by fixing one model's output to its value at a given step. Indeed, any Markov function that models an infrequently discontinuous process may be made into a viable estimator by reusing state in a similar way. However, if each cycle through the process is one Markov step, then one of the dependencies need to be selected to act as a bridge between steps. For example, each Markov step can use the usage for the current day to compute the usage and feature release date for the next day, or it can use the current day's feature release date. The more stable the bridge dependency value is, the faster the analysis tool can identify a mapping. In the example, the feature release date is a better choice for a bridge dependency, as it is updated by step function; no mapping is required, because either the fingerprints are equal, or they are not.

The analysis tool addresses the issue of bridge dependency selection by addressing a second, related issue. Dependencies can be specified in the analysis tool by piping the output of one black box function to another in the scenario specification query; the dependencies are expressed in ordinary SQL. However, native SQL does not allow users to specify cyclical dependencies. To address this, The analysis tool provides a special parameter type, the chain parameter as illustrated below:

```
-- DEFINITION -
DECLARE PARAMETER @current_week
  AS RANGE 0 TO 52 STEP BY 1;
DECLARE PARAMETER @release_week
  AS CHAIN release_week
  FROM @current_week : @current_week - 1
  INITIAL VALUE 52;
SELECT ReleaseWeekModel(demand) AS release_week, demand
FROM (SELECT demand
    FROM DemandModel(@current_week, @ release_week))
--BATCH MODE -
```

Normal parameters in the analysis tool are specified in terms of sets or sequences. Each chain parameter is tightly coupled to a non-Markovian parameter, which defines the step identifiers for the process. The FROM field of chain parameter definition declares this coupling and states how step identifiers are related. The remaining two fields: INITIAL VALUE and CHAIN specify an initial value and a query output identifier, respectively. When one step of the query is evaluated, the parameter takes on the corresponding value. Because the user already has to explicitly close the cycle using a chain parameter, the analysis tool uses the user's choice as a bridge dependency.

The analysis tool's heuristic approach to sampling is also suited to the task of online what-if exploration. Moreover, the sort of parameter exploration problems that the analysis tool addresses also often benefit from having a human in the loop, as imprecise goal conditions that are difficult to specify programmatically often may be reached easily by an expert human operator.

A human operator indicates which regions of the parameter space are interesting, and the analysis tool provides progressively more accurate results for that region. Metadata supplementing the simulation query allows the analysis tool to interpret the query results and to produce and progressively refine a graphical representation of the query output for a given set of parameter values.

Unlike offline analysis, the goal of online analysis via the tool is to rapidly produce accurate metrics for a small set of points in the parameter space. Fingerprinting may be used to improve the accuracy of the analysis tool's initial guesses; a very small and quickly generated fingerprint allows the analysis tool to identify a matching basis distribution and reuse metrics pre-computed for it.

The analysis tool provides refinement, in that once the initial guess is generated, the analysis tool begins generating further samples for points (i.e., parameter values) of interest. In addition to improving the accuracy of the displayed results, the new samples are used to improve the accuracy of the basis distribution's pre-computed metrics.

The analysis tool also provides validation; latency has a bearing on the size of fingerprint. Larger fingerprints produce more accurate estimates, but take longer to produce. However, in an online setting, the analysis tool constructs the fingerprint progressively. While generating additional samples for the basis distribution, the analysis tool also reproduces samples for the points of interest that are already present in the basis distribution. The duplicate samples extend point's fingerprint and validate the existing mapping; if they do not match the values mapped from the basis distribution, the analysis tool attempts to find a matching fingerprint.

The analysis tool also facilitates exploration. In addition to the refinement and validation processing tasks, the analysis tool heuristically selects points in the parameter space that are likely to be of interest to the user in the near future (e.g., adjacent points in a discrete parameter space). For each point explored, the analysis tool generates a fingerprint (if none exists), or extends the point's basis distribution with a small number of additional samples. Note that described herein is a distinction between samples produced for fingerprints and those produced for basis distributions; however, in most cases there is no difference between either process. For any invertible mapping function, samples are generated directly for the point of interest, and mapped back to the basis distribution by the inverse mapping function. Thus, the online analysis tool is based upon a relatively simple pick-evaluate-update process: (1) Pick the next set of (point, sampleID) pairs to generate samples for, (2) Evaluate the query, and (3) Update the fingerprint, basis, and mapping. This process is exemplified in Algorithm 5:

---

Algorithm 5 SimplifiedEventLoop(p, State)

Require: One point of interest p. A lookup table State [ ]
         containing, for all points: a mapping function F, the
         point's fingerprint, and the point's basis distribution.
  1:    loop
  2:        (fingerprint, basis, F) ← State[p]

```
Algorithm 5 SimplifiedEventLoop(p, State)

3:     next ← p
 4:     task ← TaskHeuristic(p)
 5:     if task = refinement then
 6:         candidate_ids ← {id|id ∉ basis}
 7:     else if task = validation then
 8:         candidate_ids ← {id|id ∈ basis ^ id ∉ fingerprint}
 9:     else if task = exploration then
10:         next ← ExploreHeuristic(p)
11:         if State[next].fingerprint ≠ φ then
12:             candidate_ids ← [id|id ∉ State[next].basis}
13:         else
14:             candidate_ids ← [0, 10]
15:     sample_ids ← PickAtRandom(10, candidate_ids)
16:     values ← EvaluateBlackBox(next, sample_ids)
17:     State[next].fingerprint ←
18:         State[next].fingerprint ∪ values
19:     if F(State[next].basis) and State[next].fingerprint
            are not consistent then
20:         (State[next].basis, State[next].F) ←
21:             FindMatch(State[next].fingerprint)
22:     else
23:         State[next].basis ←
24:             State[next].basis ∪ F$^{(-1)}$ (values)
```

Exemplary Operating Environment

Figure 3:
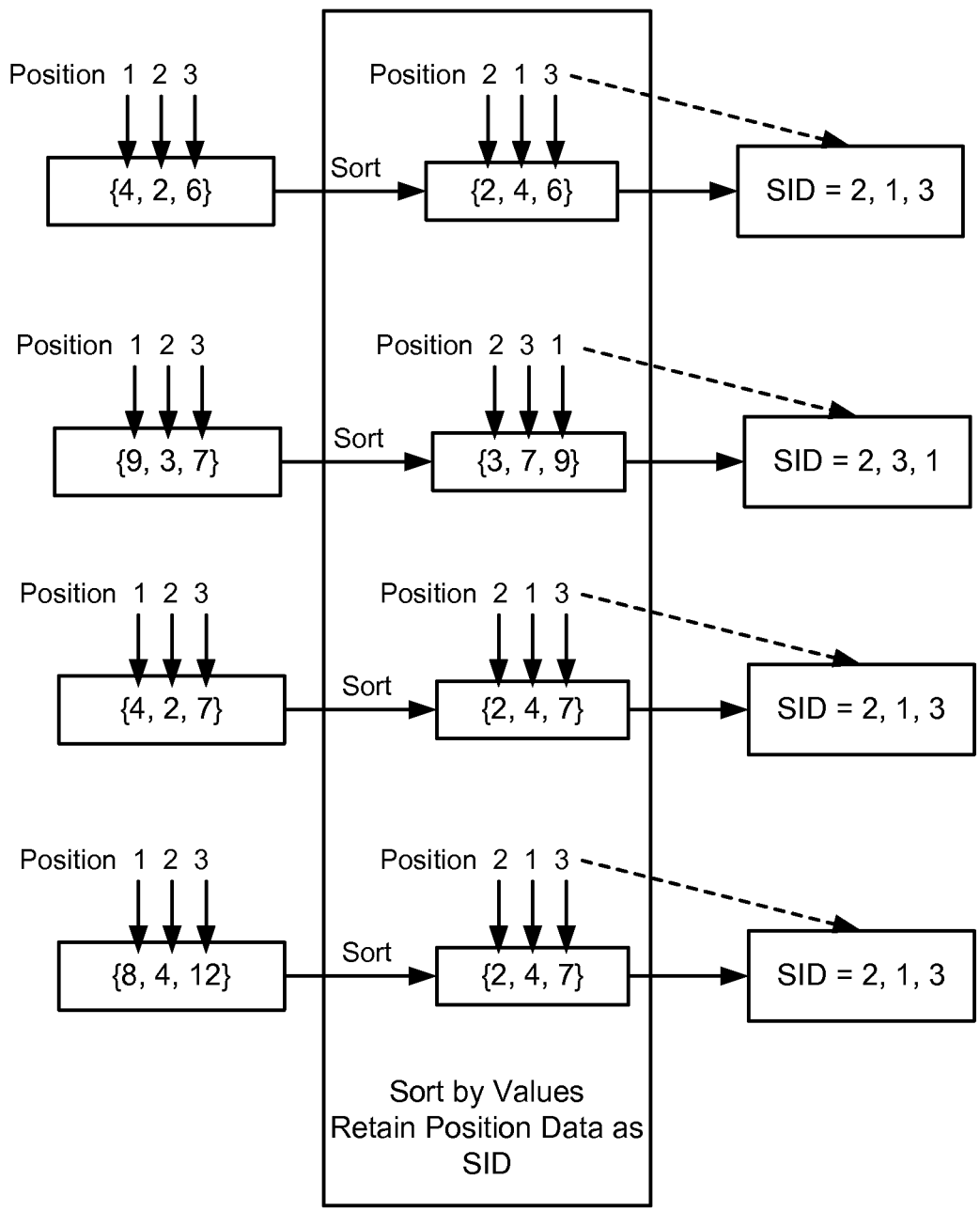
FIG. 3 is an example representation of sorting fingerprints to obtain a hash index value to facilitate efficient fingerprint lookup.
Figure 4:
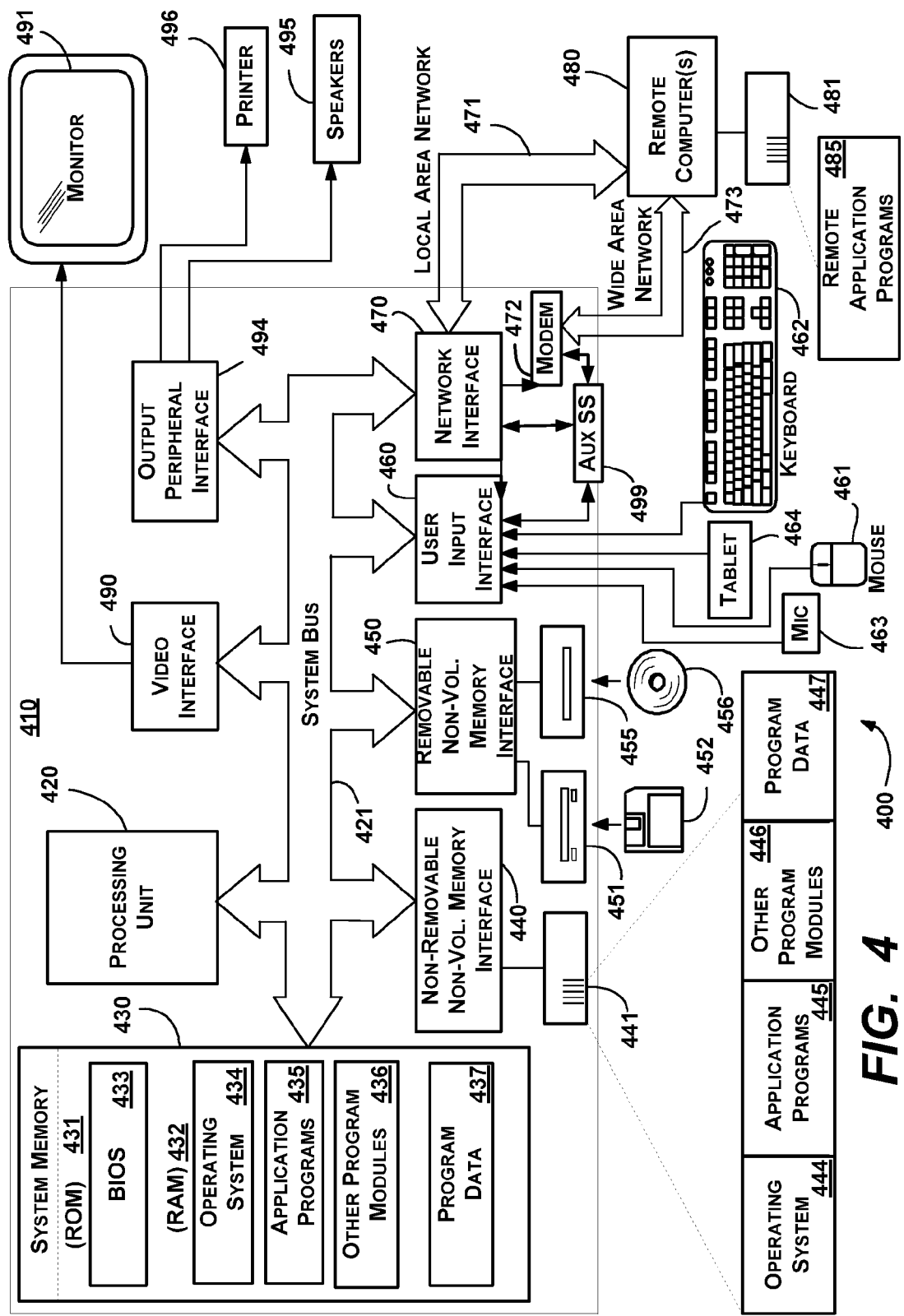
FIG. 4 is a block diagram representing an exemplary computing environment into which aspects of the subject matter described herein may be incorporated.

FIG. 4 illustrates an example of a suitable computing and networking environment 400 on which the examples of FIGS. 1-3 may be implemented. The computing system environment 400 is only one example of a suitable computing environment and is not intended to suggest any limitation as to the scope of use or functionality of the invention. Neither should the computing environment 400 be interpreted as having any dependency or requirement relating to any one or combination of components illustrated in the exemplary operating environment 400.

The invention is operational with numerous other general purpose or special purpose computing system environments or configurations. Examples of well-known computing systems, environments, and/or configurations that may be suitable for use with the invention include, but are not limited to: personal computers, server computers, hand-held or laptop devices, tablet devices, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, and so forth, which perform particular tasks or implement particular abstract data types. The invention may also be practiced in distributed computing environments where tasks are performed by remote processing devices that are linked through a communications network. In a distributed computing environment, program modules may be located in local and/or remote computer storage media including memory storage devices.

With reference to FIG. 4, an exemplary system for implementing various aspects of the invention may include a general purpose computing device in the form of a computer 410. Components of the computer 410 may include, but are not limited to, a processing unit 420, a system memory 430, and a system bus 421 that couples various system components including the system memory to the processing unit 420. The system bus 421 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The computer 410 typically includes a variety of computer-readable media. Computer-readable media can be any available media that can be accessed by the computer 410 and includes both volatile and nonvolatile media, and removable and non-removable media. By way of example, and not limitation, computer-readable media may comprise computer storage media and communication media. Computer storage media includes volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by the computer 410. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above may also be included within the scope of computer-readable media.

The system memory 430 includes computer storage media in the form of volatile and/or nonvolatile memory such as read only memory (ROM) 431 and random access memory (RAM) 432. A basic input/output system 433 (BIOS), containing the basic routines that help to transfer information between elements within computer 410, such as during start-up, is typically stored in ROM 431. RAM 432 typically contains data and/or program modules that are immediately accessible to and/or presently being operated on by processing unit 420. By way of example, and not limitation, FIG. 4 illustrates operating system 434, application programs 435, other program modules 436 and program data 437.

The computer 410 may also include other removable/non-removable, volatile/nonvolatile computer storage media. By way of example only, FIG. 4 illustrates a hard disk drive 441 that reads from or writes to non-removable, nonvolatile magnetic media, a magnetic disk drive 451 that reads from or writes to a removable, nonvolatile magnetic disk 452, and an optical disk drive 455 that reads from or writes to a removable, nonvolatile optical disk 456 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 441 is typically connected to the system bus 421 through a non-removable memory interface such as interface 440, and magnetic disk drive 451 and optical disk drive 455 are typically connected to the system bus 421 by a removable memory interface, such as interface 450.

The drives and their associated computer storage media, described above and illustrated in FIG. 4, provide storage of computer-readable instructions, data structures, program modules and other data for the computer 410. In FIG. 4, for example, hard disk drive 441 is illustrated as storing operating system 444, application programs 445, other program modules 446 and program data 447. Note that these components can either be the same as or different from operating system 434, application programs 435, other program modules 436, and program data 437. Operating system 444, application programs 445, other program modules 446, and program data 447 are given different numbers herein to illustrate that, at a minimum, they are different copies. A user may enter commands and information into the computer 410 through input devices such as a tablet, or electronic digitizer, 464, a microphone 463, a keyboard 462 and pointing device 461, commonly referred to as mouse, trackball or touch pad. Other input devices not shown in FIG. 4 may include a joystick, game pad, satellite dish, scanner, or the like. These and other input devices are often connected to the processing unit 420 through a user input interface 460 that is coupled to the system bus, but may be connected by other interface and bus structures, such as a parallel port, game port or a universal serial bus (USB). A monitor 491 or other type of display device is also connected to the system bus 421 via an interface, such as a video interface 490. The monitor 491 may also be integrated with a touch-screen panel or the like. Note that the monitor and/or touch screen panel can be physically coupled to a housing in which the computing device 410 is incorporated, such as in a tablet-type personal computer. In addition, computers such as the computing device 410 may also include other peripheral output devices such as speakers 495 and printer 496, which may be connected through an output peripheral interface 494 or the like.

The computer 410 may operate in a networked environment using logical connections to one or more remote computers, such as a remote computer 480. The remote computer 480 may be a personal computer, a server, a router, a network PC, a peer device or other common network node, and typically includes many or all of the elements described above relative to the computer 410, although only a memory storage device 481 has been illustrated in FIG. 4. The logical connections depicted in FIG. 4 include one or more local area networks (LAN) 471 and one or more wide area networks (WAN) 473, but may also include other networks. Such networking environments are commonplace in offices, enterprise-wide computer networks, intranets and the Internet.

When used in a LAN networking environment, the computer 410 is connected to the LAN 471 through a network interface or adapter 470. When used in a WAN networking environment, the computer 410 typically includes a modem 472 or other means for establishing communications over the WAN 473, such as the Internet. The modem 472, which may be internal or external, may be connected to the system bus 421 via the user input interface 460 or other appropriate mechanism. A wireless networking component such as comprising an interface and antenna may be coupled through a suitable device such as an access point or peer computer to a WAN or LAN. In a networked environment, program modules depicted relative to the computer 410, or portions thereof, may be stored in the remote memory storage device. By way of example, and not limitation, FIG. 4 illustrates remote application programs 485 as residing on memory device 481. It may be appreciated that the network connections shown are exemplary and other means of establishing a communications link between the computers may be used.

An auxiliary subsystem 499 (e.g., for auxiliary display of content) may be connected via the user interface 460 to allow data such as program content, system status and event notifications to be provided to the user, even if the main portions of the computer system are in a low power state. The auxiliary subsystem 499 may be connected to the modem 472 and/or network interface 470 to allow communication between these systems while the main processing unit 420 is in a low power state.

CONCLUSION

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

In addition to the various embodiments described herein, it is to be understood that other similar embodiments can be used or modifications and additions can be made to the described embodiment(s) for performing the same or equivalent function of the corresponding embodiment(s) without deviating therefrom. Still further, multiple processing chips or multiple devices can share the performance of one or more functions described herein, and similarly, storage can be effected across a plurality of devices. Accordingly, the invention is not to be limited to any single embodiment, but rather is to be construed in breadth, spirit and scope in accordance with the appended claims.

What is claimed is:

1. In a computing environment, a computer-implemented method performed at least in part on at least one processor, comprising, obtaining a current fingerprint representative of a current parameter combination for use in an uncertain data simulation, determining whether a previous fingerprint was obtained that matches the current fingerprint, and if so, reusing simulation results associated with the fingerprint that matches to provide simulation results for the current parameter combination, and if not, running a simulation using the current parameter combination to obtain the simulation results for the current parameter combination.

2. The computer-implemented method of claim 1 wherein obtaining the current fingerprint representative of the current parameter combination comprises running a partial simulation using the current parameter combination to obtain partial results, and using the partial results in the current fingerprint.

3. The computer-implemented method of claim 2 further comprising selecting a set of random tables for running the partial simulation to obtain the partial results, in which the random tables correspond to random tables selected for obtaining each previous fingerprint.

4. The computer-implemented method of claim 1 wherein a similar fingerprint does not exist, and further comprising, maintaining data representative of the current fingerprint in association with the simulation results for the current parameter combination.

5. The computer-implemented method of claim 1 wherein determining whether a previous fingerprint exists that matches the current fingerprint comprises determining that a fingerprint that matches is similar to the current fingerprint by way of having a mathematical relationship with the current fingerprint.

6. The computer-implemented method of claim 5 wherein reusing the simulation results associated with the similar fingerprint to provide simulation results for the current parameter combination comprises adjusting the simulation results for the current parameter based upon the mathematical relationship.

7. The computer-implemented method of claim 1 wherein determining whether a previous fingerprint exists that matches the current fingerprint comprises determining that a fingerprint that matches is similar to the current fingerprint by way of having a linear relationship with the current fingerprint.

8. The computer-implemented method of claim 1 wherein determining whether a previous fingerprint exists that matches the current fingerprint comprises maintaining the previous fingerprint as a normalized representation of the previous fingerprint, normalizing the current fingerprint into a normalized representation of the current fingerprint, and determining whether the normalized representation of the previous fingerprint matches the normalized representation of the current fingerprint.

9. The computer-implemented method of claim 1 wherein reusing the simulation results associated with the fingerprint that matches to provide simulation results for the current parameter combination comprises adjusting the simulation results for the current parameter to account for the normalizing.

10. The computer-implemented method of claim 1 further comprising, maintaining an index representative of a set of previously obtained fingerprints.

11. The computer-implemented method of claim 10 wherein maintaining the index comprises maintaining normalized representations of at least some of the previously obtained fingerprints.

12. The computer-implemented method of claim 10 wherein maintaining the index comprises determining an identifier representative of a fingerprint based upon sorting results in the fingerprint, and using position information of the results in the identifier.

13. The computer-implemented method of claim 12 wherein determining whether a previous fingerprint exists that is similar or identical to the current fingerprint comprises determining an identifier representative of the current fingerprint based upon sorting results in the current fingerprint, using the identifier to retrieve candidate fingerprints from the index, and determining whether a candidate fingerprint is similar or identical to the current fingerprint.

14. In a computing environment, a system comprising:
a memory coupled to a bus system, wherein the memory comprises computer useable program code; one or more processing units, wherein the one or more processing units execute the computer useable program code to provide for:
a probabilistic database system analysis tool, the probabilistic database system analysis tool configured to process data maintained in probabilistic database tables, the probabilistic database system analysis tool coupled to a fingerprint mechanism, and the fingerprint mechanism configured to maintain fingerprint data representative of subsets of probabilistic database table processing operations, wherein the probabilistic database system analysis tool is configured to obtain a current fingerprint representative of a current parameter combination for use in an uncertain data simulation, to determine whether a previous fingerprint was obtained that matches the current fingerprint, and if so, to reuse simulation results associated with the fingerprint that matches to provide simulation results for the for the current parameter combination, and if not, to run a simulation using the current parameter combination to obtain the simulation results for the current parameter combination.

15. The system of claim 14 wherein the subsets of table processing operations comprise simulations for different parameter combinations.

16. The system of claim 14 wherein the subsets of table processing operations correspond to inter-model dependency processing.

17. The system of claim 14 wherein the subsets of table processing operations correspond to refinement, validation, or exploration processing tasks.

18. One or more computer hardware storage devices having computer-executable instructions, which when executed perform steps, comprising:
running a simulation using a parameter combination to obtain simulation results;
obtaining a fingerprint representative of part of the simulation results;
maintaining fingerprint data corresponding to the fingerprint in association with the simulation results;
obtaining a current fingerprint representative of part of partial simulation results for another parameter combination;
determining from the fingerprint data whether the current fingerprint matches a fingerprint for which simulation results were obtained, and if so, using the simulation results associated with the identical or similar fingerprint to provide simulation results for the current fingerprint.

19. The one or more computer hardware storage devices of claim 18 wherein maintaining the fingerprint data comprises maintaining an index by which data corresponding to the current fingerprint is used to look for a fingerprint that matches.

20. The one or more computer hardware storage devices of claim 18 wherein the current fingerprint matches a fingerprint for which simulation results were obtained by being similar thereto, and wherein using the simulation results associated with the fingerprint that matches to provide simulation results for the current fingerprint comprises adjusting the simulation results based upon a similarity relationship between the current fingerprint and the fingerprint that matches.

* * * * *